United States Patent
Antonakopoulos et al.

(10) Patent No.: US 8,214,718 B2
(45) Date of Patent: Jul. 3, 2012

(54) ERASURE FLAGGING SYSTEM AND METHOD FOR ERRORS-AND-ERASURES DECODING IN STORAGE DEVICES

(75) Inventors: Theodore A. Antonakopoulos, Patras (GR); Charalampos Pozidis, Thalwil (CH); Maria Varsamou, Patras (GR)

(73) Assignee: International Business Machines Corporation, Armonk, NY (US)

( * ) Notice: Subject to any disclaimer, the term of this patent is extended or adjusted under 35 U.S.C. 154(b) by 1049 days.

(21) Appl. No.: 12/142,390

(22) Filed: Jun. 19, 2008

(65) Prior Publication Data

US 2009/0319866 A1    Dec. 24, 2009

(51) Int. Cl.
*H03M 13/00*    (2006.01)
(52) U.S. Cl. ........ 714/762; 714/788; 324/210; 324/212; 360/77.01
(58) Field of Classification Search ................ 714/762, 714/788; 324/210, 212; 360/77.01
See application file for complete search history.

(56) References Cited

U.S. PATENT DOCUMENTS

| | | | | |
|---|---|---|---|---|
| 6,446,236 B1 * | 9/2002 | McEwen et al. | ............. | 714/795 |
| 7,124,654 B1 * | 10/2006 | Davies et al. | ................. | 73/866 |
| 8,013,982 B2 * | 9/2011 | Shibazaki | ..................... | 355/72 |

OTHER PUBLICATIONS

Chang-Ming Lee et al., Errors-and-Erasures Decoding of Block Codes in Hidden Markov Channels; IEEE; 2001; pp. 1425-1429.
Ryan et al., A Method of Analysis for Interleaved Reed-Solomon Coding with Erasure Decoding on Burst Error Channels; IEEE Trans on Communications, vol. 41, No. 3, Mar. 1993; pp. 430-434.
Sankaranarayanan et al., Performance of Product Codes on Channels with Memory; Proceedings. International Symposium; Sept. 2005; pp. 548-552.

\* cited by examiner

*Primary Examiner* — Guy Lamarre
(74) *Attorney, Agent, or Firm* — Tutunjian & Bitetto, P.C.; Daniel P. Morris, Esq.

(57) ABSTRACT

A system and method for erasure flagging for errors-and-erasures decoding in storage devices includes determining a deviation measure between a read/write head position relative to a track of symbols in storage media. A reliability value is determined for the symbols based on the deviation measure. Flagging the symbols with a reliability value below a threshold as erasures is performed. The symbols are decoded using errors-and-erasures decoding in an iterative procedure.

23 Claims, 7 Drawing Sheets

ERASURE FLAGGING SYSTEM AND METHOD FOR ERRORS-AND-ERASURES DECODING IN STORAGE DEVICES

BACKGROUND

1. Technical Field

The present invention relates to error detection and correction in digital stored media, and more particularly to systems and methods for erasure flagging in errors-and-erasures decoding for enhancing the reliability of storage devices by improving the decoding performance.

2. Description of the Related Art

Error correction codes (ECC) are ubiquitously used in communications and storage devices to improve the reliability of detected bits. Storage devices in particular are prone to errors that occur in bursts in addition to errors that occur at random. Causes of burst errors include mechanical disturbances such as shocks and vibrations (e.g., dropping a device, etc.) and loss of synchronization in the timing recovery loop of the read channel.

It is known that, in the presence of burst errors, the performance of the ECC, and thus of the system, can be significantly improved by resorting to errors-and-erasures decoding (EED) as opposed to error decoding only. Simply speaking, an erasure on a symbol indicates that the detector believes this symbol is not reliable, and thus has a high probability of being detected in error.

A main drawback of EED is that its performance deteriorates quickly when the erasures are not set correctly. There are several approaches that have been taken in the past to solve this problem. In one approach, an erasure is declared (flagged) whenever the symbol amplitude at a threshold detector input lies in a "grey zone" around the detector thresholds. In another, all symbols below a given threshold SNR (signal to noise ratio) are flagged as erasures. In still another, the Euclidean distance of sequences of symbols of a Viterbi detector is used as an erasure indicator. The soft-output Viterbi algorithm has also been used for erasure flagging.

All the above methods have the same drawback. Namely, the erasure flagging method is not sufficiently reliable. The probability of not flagging an erroneous symbol as an erasure (probability of mis-detection) and the probability of declaring an erasure on a correct symbol (false-alarm probability) are both high, thus leading to very small performance gains, or even performance losses with respect to the errors-only decoding case.

SUMMARY

A system and method for erasure flagging for errors-and-erasures decoding in storage devices includes determining a deviation measure of a read/write head position relative to a track of symbols in a storage medium. A probability of error is determined for the symbols based on the deviation measure. Erasure flagging of the symbols with a probability of error in accordance with a threshold is performed. The symbols are decoded using errors-and-erasures decoding.

A system for erasure flagging for errors-and-erasures decoding in storage devices includes a head configured to interact with data tracks formed on a storage medium. The tracks have a geometrical reference against which a position of the head can be measured. A sensor is configured to determine a position of the head relative to the geometrical reference of the track. A processor is configured to compute a deviation from the position of the head relative to the geometrical reference. The processor is further configured to determine a reliability value for each symbol in the track based upon the deviation for that symbol, and to flag symbols as erasures based upon the determined reliability A decoder is configured to perform errors-and-erasures decoding of the symbols.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

The present principles address the problem of enhancing the reliability of storage devices by improving the decoding performance of error correction coding schemes. The present embodiments provide a mechanism for producing highly reliable erasures. Erasure flagging in accordance with the present principles is not based on the channel symbols, which may be unreliable, but on side information that describes the movement of the heads with respect to the written tracks. In some storage applications, an independent sensor is used to sense a position of read/write head(s) with respect to written tracks in the storage medium. Examples include probe storage devices, among others.

In other cases, other ways to sense the lateral position of the head(s) also exist, such as, reading of pre-written servo patterns on a storage medium. Examples include hard disc drives, tape drives, optical drives, probe storage, etc.

In all of these cases, a signal is provided which corresponds to an estimate of the lateral position of the head(s) with respect to the center of the respective track(s). A deviation of the head from the track center is directly related to the signal to noise ratio (SNR) and also the bit-error-rate in the device.

This information can be used to flag symbols as erasures, for example, whenever the head(s) lies outside of a narrow strip surrounding the track center-line during reading of these symbols.

In accordance with the present embodiments, the sensor information is employed to enhance the error-correction capability of the error correction code (ECC) scheme, by estimating the probability that an ECC symbol is incorrect and performing errors-and-erasures decoding.

Embodiments of the present invention can take the form of an entirely hardware embodiment, an entirely software embodiment or an embodiment including both hardware and software elements. In a preferred embodiment, the present invention is implemented in software, which includes but is not limited to firmware, resident software, microcode, etc.

Furthermore, the invention can take the form of a computer program product accessible from a computer-usable or computer-readable medium providing program code for use by or in connection with a computer or any instruction execution system. For the purposes of this description, a computer-usable or computer readable medium can be any apparatus that may include, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code may include at least one processor coupled directly or indirectly to memory elements through a system bus. The memory elements can include local memory employed during actual execution of the program code, bulk storage, and cache memories which provide temporary storage of at least some program code to reduce the number of times code is retrieved from bulk storage during execution. Input/output or I/O devices (including but not limited to keyboards, displays, pointing devices, etc.) may be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

In one embodiment, features of the present embodiments may be part of the design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., Graphic Data System II (GDSII)) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 1:
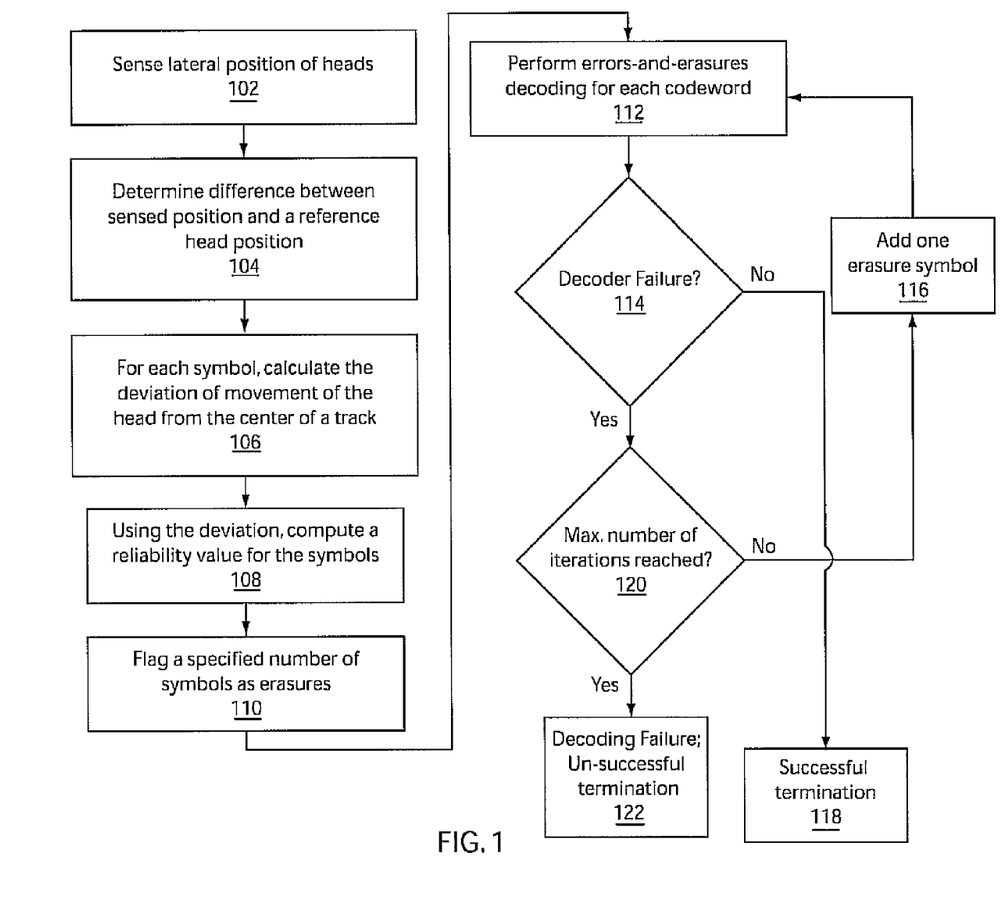
FIG. 1 is a block/flow diagram showing a system/method for erasure flagging using head deviations in errors-and-erasures decoding in storage devices.

Referring now to the drawings in which like numerals represent the same or similar elements and initially to FIG. 1, a system/method for erasure flagging is illustratively shown in accordance with one illustrative embodiment. Advantageously, in accordance with the present principles, erasure flagging is not based on the channel symbols, which may be unreliable, but on side information that describes the movement of the heads with respect to the written tracks. In other words, erasure flagging relies on independent information gathered from a different source to provide additional evidence to confirm whether stored information is reliable.

In block 102, in many storage applications, an independent sensor is used to sense the position of the head(s) with respect to written tracks in the storage medium. Examples include probe storage devices. In other cases, other ways to sense the lateral position of the head(s) exist, such as reading of prewritten servo patterns on the storage medium. Examples include hard disc drives, tape drives, optical drives and probe storage.

Figure 2:
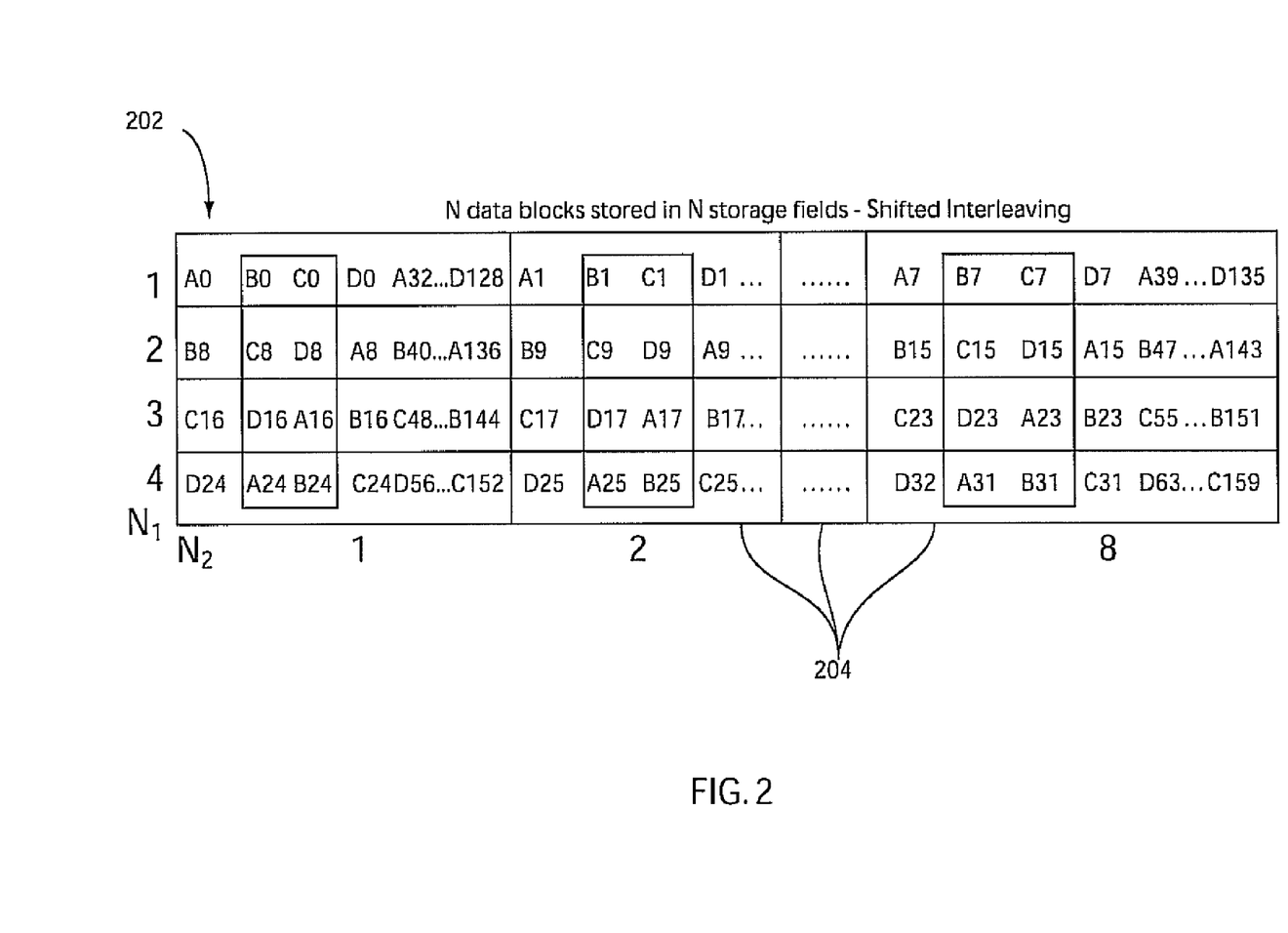
FIG. 2 is a table conceptually showing storage fields in a data allocation example for a probe storage application.

FIG. 2 shows an illustrative table 202 showing 32 storage fields 204 ($N_1 \times N_2$ where $N_1=4$ and $N_2=8$) for probe storage. A 512-byte sector that comprises 4 codewords is stored in the 32 storage fields 204. The bytes (e.g., A0, B0, B8, C8, D135, etc.) are preferably encoded, in this case using Reed Solomon (RS) code, e.g., RS (151, 129). Other encoding schemes may also be employed. The N data blocks are stored in the 32 storage fields 204 using interleaving to provide the pattern shown. A physical embodiment for one of the storage fields of table 202 is illustratively depicted in FIG. 3.

Figure 3:
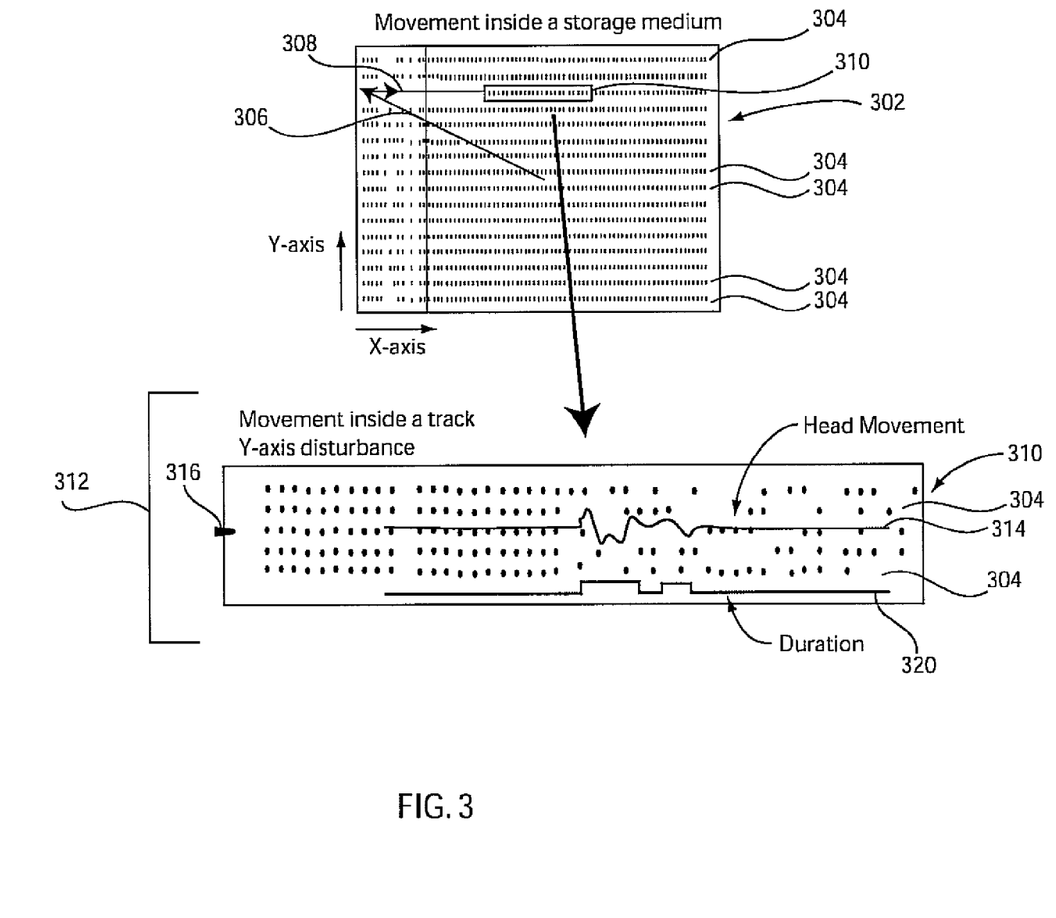
FIG. 3 is a diagram showing a physical storage media with tracks and indicating a magnified detail to further demonstrate the data storage tracks and deviations of head position relative to the track.

Referring to FIG. 3, a storage medium 302 is shown having data stored thereon in tracks 304. In this case, the tracks 304 are formed parallel to an x-axis and perpendicular with a y-axis. A read/write head (not shown) is positioned to read/write data from tracks 304. The position of the head and its relative movement 306, 308 with respect to the media 302, can be determined using a sensor (not shown). A portion 310 of a group of tracks 304 is shown in a magnified view in an inset 312 of FIG. 3. It should be understood that the tracks may be linear or circular or any other regular shape where deviation of the head can be measured against the tracks or a reference on the track.

In inset 312, a signal 314 is provided which corresponds to an estimate of the lateral position of a head(s) with respect to a center 316 of the respective track(s) 304. A deviation of the head from the track center 316 (or other reference point) directly affects the SNR and also the bit-error-rate in the device. This information can be used to flag symbols as erasures, whenever the head(s) lies outside of a narrow strip surrounding the track center-line 316 (or other reference region), during reading of those symbols. A duration or time reference 320 may also be employed to assist in collecting information about the reliability of the read operation.

In block 104, in FIG. 1, we use a signal difference between the head movement as it is seen by the sensor and the reference movement for the cross-track direction (e.g., relative to the center line or other reference position on the media). In block 106, with this, for each symbol, we calculate the deviation of the movement of the head from the center of the track. In block 108, the deviation from the track is employed to compute a probability of symbol error as a result of the deviation. The sensor information is exploited to enhance the error-correction capability of the error correction code (ECC) scheme, by estimating the probability that an ECC symbol is incorrect, flagging unreliable symbols as erasures, and performing errors-and-erasures decoding.

Figure 4:
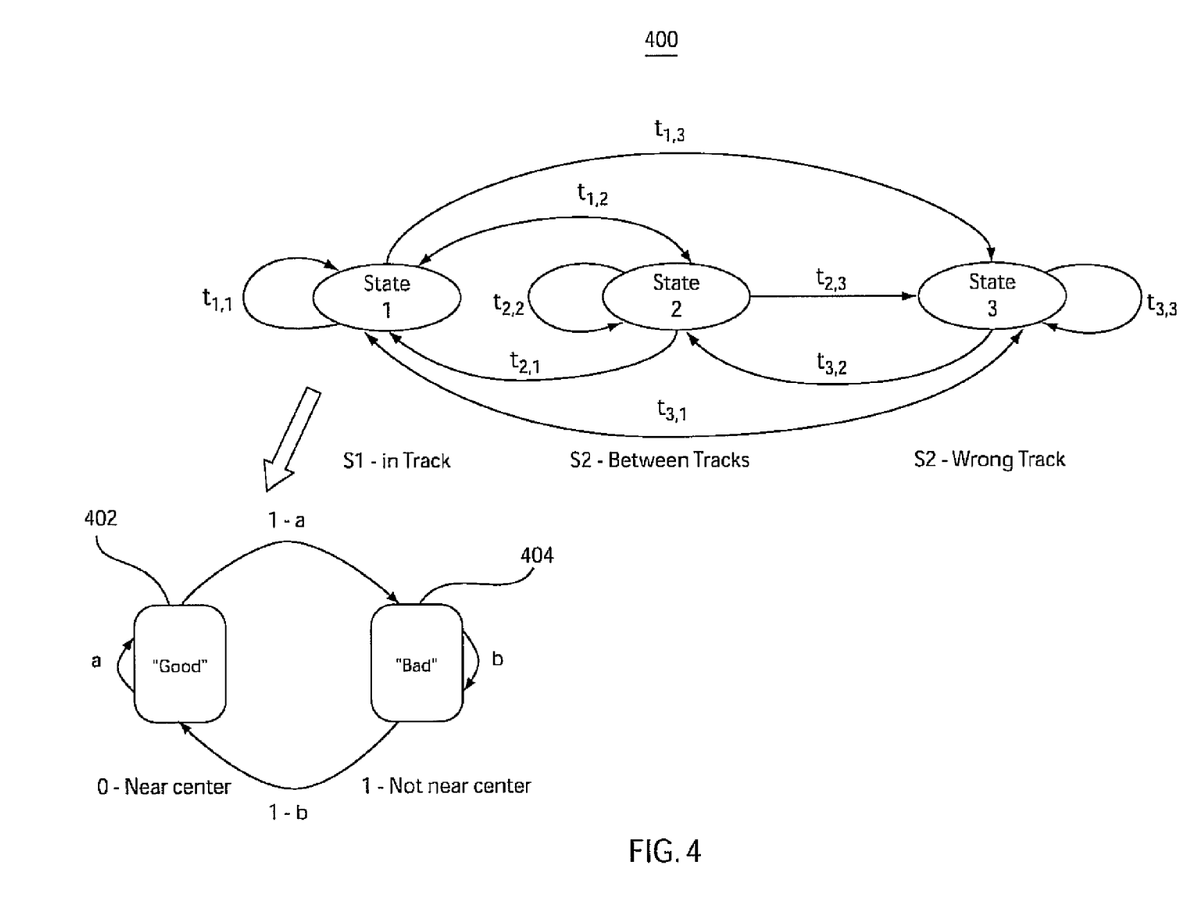
FIG. 4 is a state diagram for a Hidden Markov Model (HMM) employed in determining probabilities of error using deviation measures for the head position.

Referring to FIG. 4, a Hidden Markov Model (HMM) state diagram 400 is illustratively shown. To model the relation between the deviation of movement and the errors that appear in detected bits, we use the HMM 400 with three states (State 1, State 2, State 3 or S1, S2 or S3, respectively). State 1 corresponds to the head moving within a track, as it is defined by track pitch "TP". This state is sub-divided into two sub-states 402 and 404, a "good" one and a "bad" one. Other sub-states for this and other states may also be employed. The system is in state "good" while the head is moving in a strip of a certain width around the center of the track. In this state, the probability of error is near 0 (actually equal to the random error rate of the device). The system is in state "bad" while the head is moving within the track but outside a defined strip around the center (within a tolerance window). Here, the probability of error is higher. State 2 corresponds to movement of the head in the space between tracks. Here, assuming a particular channel model, the probability of error when the stored symbol is "0" is 0, whereas for a "1" the probability of error is 1. For other channel models, the probabilities can be accordingly defined.

State 3 corresponds to head movement within a different track. From experimental measurements, one can derive an estimate of the probabilities of error when the original symbol is "0" or "1" in all the above states. This may be based on accumulated statistical data, e.g., given certain conditions the probability of error is X %. This information may be provide using a look up table or computed from a model or formula. There may be a greater or lesser number of states as desired.

At any given time, the system is in one of the states, e.g., S1, S2 or S3. Therefore, the sum of the probabilities in being in one of those states is 1, $\Sigma_i P(S_i)=1$, where $P(S_i)$ denotes the probability of the system being in state $S_i$, i=1, 2, 3 at the current time. The probability of a symbol error, since we are dealing with binary symbols, is:

$$P_e = P(1/0)P(0) + P(0/1)P(1), \quad (1)$$

where $P(i/j)$ denotes the probability of deciding in favor of symbol i given that symbol j is actually written on the medium.

These probabilities can be calculated based on the total probability theorem as:

$$P(i/j) = P(i/j, S_1)P(S_1) + P(i/j, S_2)P(S_2) + P(i/j, S_3)P(S_3), \quad (2)$$

where $P(i/j, S_k)$ denotes the probability of deciding i, given j is actually true, and given that the system is in state $S_k$. If one knows the current state of the system, which is the case in the present invention, then the probability of error in the given state is calculated as:

$$P(e/S_k) = P(1/0, S_k)P(0) + P(0/1, S_k)P(1). \quad (3)$$

Accordingly, the probability of a correct symbol decision (c) in state $S_k$ is calculated as $P(c/S_k)=1-P(e/S_k)$. In one embodiment, the probability of a sequence of p symbols being in error is calculated as:

$$P_e^p = 1 - \prod_i P(c/S^i), \quad (4)$$

where $S^i$ denotes the state of the system while symbol i of the sequence of p symbols is read, and where $S^i \in \{S_1, S_2, S_3\}$.

In an example, during a read operation, the head position deviation measurement may be used to specify in which state the system is for each symbol. Then, for each detected symbol "0" or "1" the probability of the decision being correct is given by equations (1)-(4) above. If a Reed-Solomon error correction code is used (which is the case in most storage products today), operating over "bytes" of (p)-bits, the probability of a "byte" being in error may be calculated in accordance with equation (4). It should be understood that the probabilities and the encoding methods may be changed or alternates used depending on the application employed and the criteria being enforced.

Once the error probability or other reliability value is calculated for all the symbols in each RS codeword, the erasure flagging is based on an iterative procedure. In block 110, we flag as erasure symbols, the 2 symbols with the highest error probabilities and perform errors-and-erasures decoding for each codeword in block 112. In block 114, if the decoder fails, we add one erasure symbol on, in block 116 and try again. We repeat this process until either the decoder is successful in block 118 or we have reached a maximum number of iterations in block 120, which in any case is set to a number significantly smaller than the minimum distance of the RS code. If the maximum number of iterations is reached, a decoding failure is indicated as an unsuccessful termination in block 122. Experimental and simulation results have shown that most often 2 or 3 iterations are enough for successful decoding.

Figure 5:
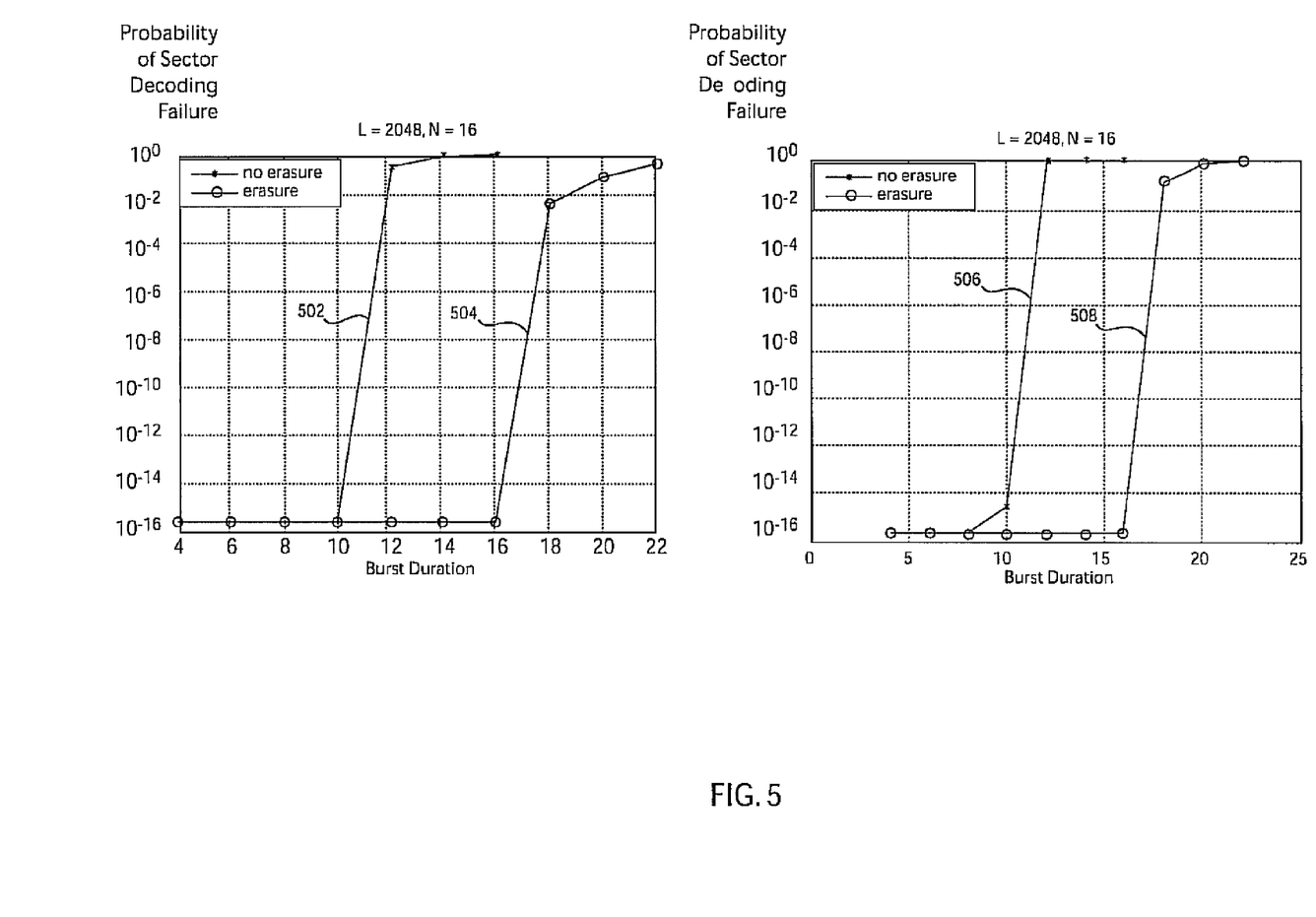
FIG. 5 is a set of plots showing probability of codeword decoding failure versus burst duration for a simulated shock to a memory storage device, each plot shows that the device can endure greater burst duration for errors-and-erasures decoding with erasure flagging in accordance with the present principles as opposed to errors decoding only.
Figure 6:
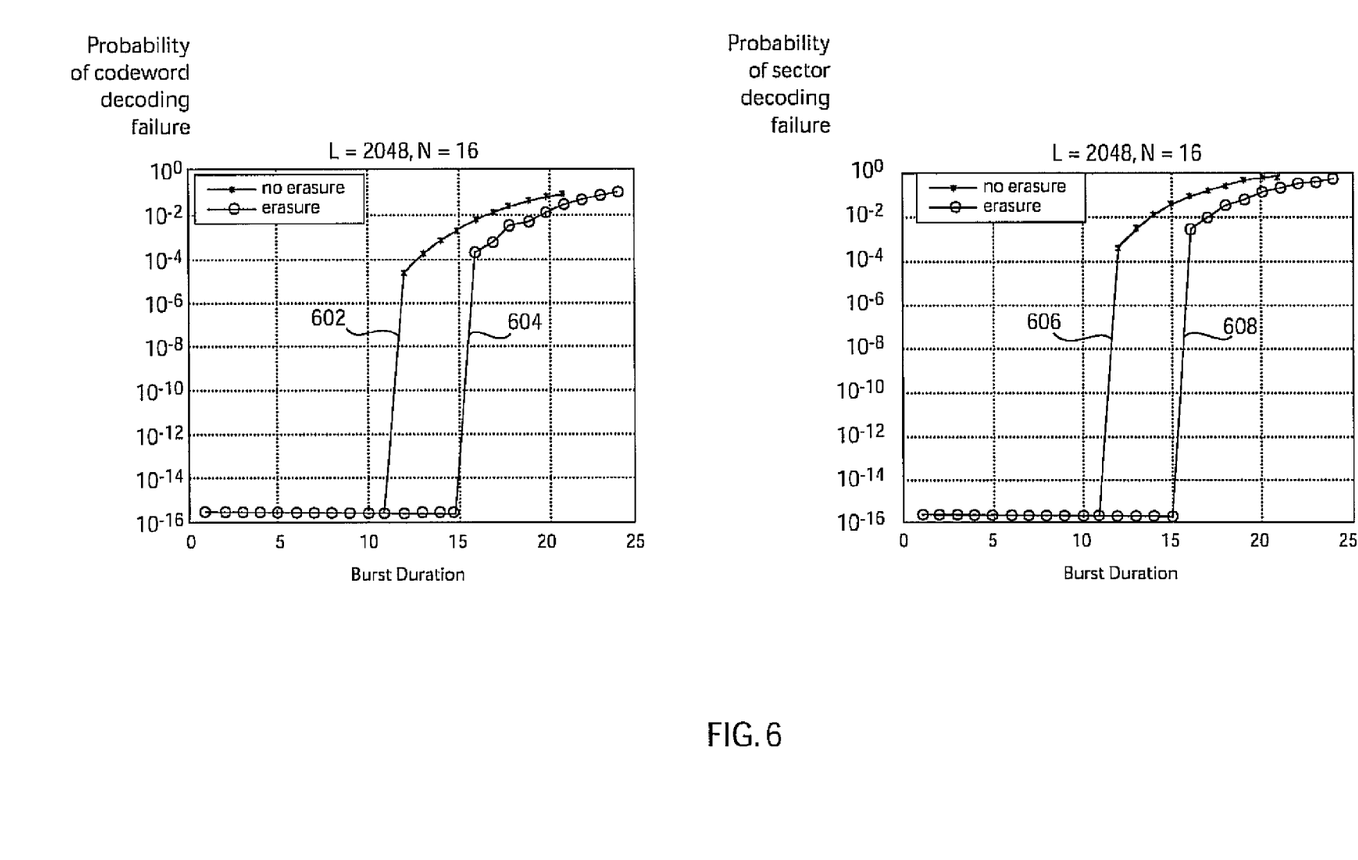
FIG. 6 is a set of plots showing probability of codeword decoding failure versus burst duration for a shock test to a memory storage device, each plot shows that the device can endure greater burst duration for errors-and-erasures decoding with erasure flagging in accordance with the present principles as opposed to errors decoding only.

Referring to FIGS. 5 and 6, the results of error-detection with erasure flagging in accordance with the present principles are illustratively shown, which have been derived from a simulator of a probe-storage device. Events causing burst errors were either simulated shocks (FIG. 5), or actual shock (FIG. 6) acceleration profiles measured experimentally under various conditions of mobile device usage. A shock profile of a half-sine wave −5 g pulse of duration of 1 msec in both x and y directions was provided. Superior performance of the errors-and-erasures (EED) decoding, shown as curves 504, 508 and 604, 608 against the errors-only decoding, shown as curves 502, 506 and 602, 606, are depicted. The left-hand side and right-hand side graphs of FIGS. 5 and 6 plot probability of codeword decoding failure versus burst duration and probability of sector decoding failure versus burst duration, respectively. The data employed in the tests included a sector size of 2048 bytes (L-2048) (for 16 storage fields) and employed a 16 head device. The number of RS(151, 129) codewords was 16 (M=16). The tests were based on burst errors only and did not include random errors.

In both cases of shocks, the EED increases the error correcting capability of the ECC from error bursts of about 10 symbols to as long to 15-16 symbols.

Figure 7:
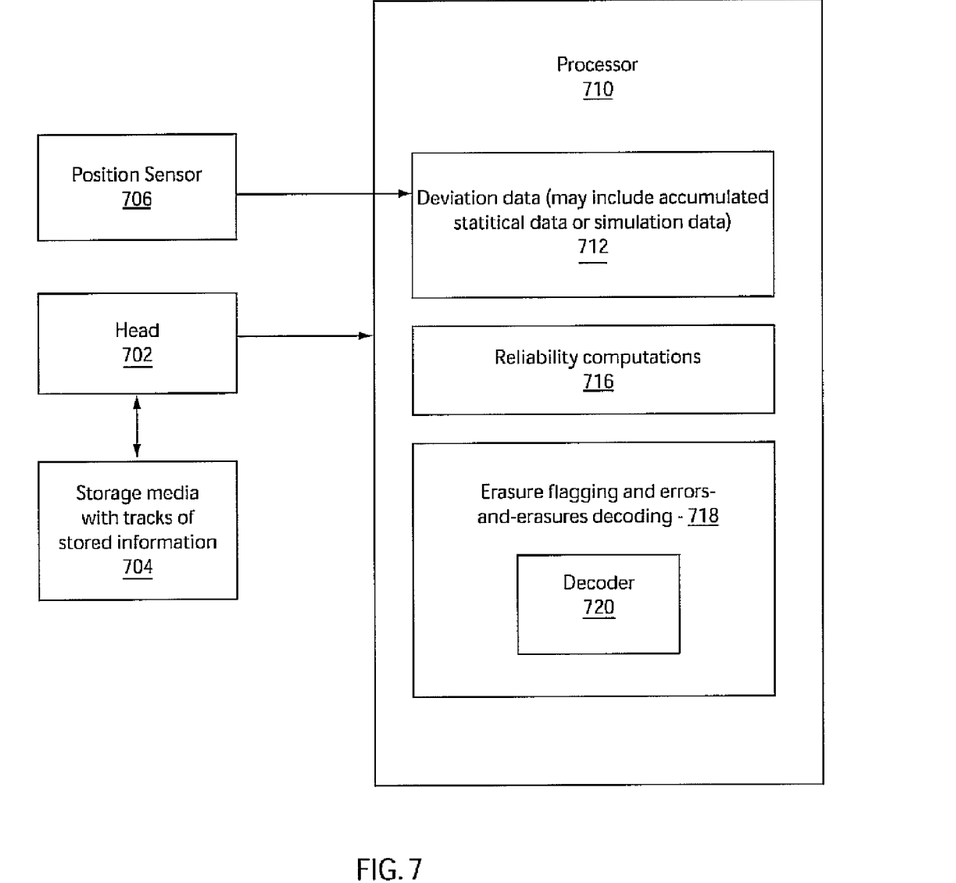
FIG. 7 is a block diagram showing a system for erasure flagging using head deviations in errors-and-erasures decoding in storage devices.

Referring to FIG. 7, a system 700 for flagging erasures in a memory device is illustratively shown in accordance with one embodiment. A read or write head 702 may be any commercially available head for detecting or writing data from/to a storage media 704. The storage media 704 may be any type of media where data is geometrically aligned in lines or curves where a center line in the track can be determined and a deviation from that centerline measured. Storage media may include magnetic tape, compact disc, digital versatile disc, disc drives, floppy discs or the like.

A position sensor 706 senses a position of the head 702 or the media 704 relative to one another and is configured to assist in determining a deviation of the head from the track centerline or other reference location. The deviation information is collected in deviation data storage unit 712 in a processor 710 or in a separate memory storage device. The deviation data are employed to compute probability or reliability value in a reliability computation module 716. Storage 712 may include simulation data or accumulated statistical data employed to determine probabilities/reliabilities with reference to system states.

In a module 718, erasure flagging and errors-and-erasures decoding is performed. Module 718 includes a decoder 720 such as Reed-Solomon decoder or the like.

Having described preferred embodiments of an erasure flagging system and method for errors-and-erasures decoding in storage devices (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A method for erasure flagging for errors-and-erasures decoding in storage devices, comprising:
    determining a deviation measure of a read/write head position relative to a track of symbols in storage media;
    computing a reliability value for the symbols based on the deviation measure;
    flagging the symbols with a reliability value below a threshold as erasures; and
    decoding the symbols using errors and erasures decoding.

2. The method as recited in claim 1, wherein determining a deviation measure includes sensing a position of the head and comparing the position to a centerline of the track being scanned.

3. The method as recited in claim 1, wherein computing a reliability value includes differentiating between states of a position of the head based on the deviation, where each state has an associated reliability value.

4. The method as recited in claim 3, wherein the deviation is characterized by three states including an on track state, an in-between tracks state and a wrong track state.

5. The method as recited in claim 3, wherein a state includes sub-states for further associating the reliability value to the deviation within the state.

6. The method as recited in claim 1, wherein the associated reliability value is computed based on one of simulations and accumulated statistical data.

7. The method as recited in claim 1, wherein computing a reliability value for the symbols based on the deviation measure includes computing a probability of error as $P(e/S_k)=P(1/0,S_k)P(0)+P(0/1,S_k)P(1)$ where $P(e/S_k)$ is the probability of error in state $S_k$ where $P(i/j, S_k)$ denotes the probability of deciding i, given j is actually true given that a system is in state $S_k$.

8. The method as recited in claim 1, further comprising: if decoding fails, iterating by adding one erasure symbol per iteration until decoding is successful or a predetermined number of iterations have been run.

9. A computer readable storage medium comprising a computer readable program for erasure flagging for errors-and-erasures decoding in storage devices, wherein the computer readable program when executed on a computer causes the computer to perform the steps of:
    determining a deviation measure of a read/write head position relative to a track of symbols in storage media;
    computing a reliability value for the symbols based on the deviation measure;
    flagging the symbols with a reliability value below a threshold as erasures; and
    decoding the symbols using errors and erasures decoding.

10. The computer readable medium as recited in claim 9, wherein determining a deviation measure includes sensing a position of the head and comparing the position to a centerline of the track being scanned.

11. The computer readable medium as recited in claim 9, wherein computing a reliability value includes differentiating between states of a position of the head based on the deviation, where each state has an associated reliability value.

12. The computer readable medium as recited in claim 11, wherein the deviation is characterized by three states for the deviation including an on track state, an in-between tracks state and a wrong track state.

13. The computer readable medium as recited in claim 11, wherein a state includes sub-states for further associating the reliability value to the deviation within a state.

14. The computer readable medium as recited in claim 9, wherein the associated reliability value is computed based on one of simulations and accumulated statistical data.

15. The computer readable medium as recited in claim 9, wherein computing a reliability value for the symbols based on the deviation measure includes computing a probability of error as $P(e/S_k)=P(1/0,S_k)P(0)+P(0/1,S_k)P(1)$ where $P(e/S_k)$ is the probability of error in state $S_k$ where $P(i/j, S_k)$ denotes the probability of deciding i, given j is actually true given that a system is in state $S_k$.

16. The computer readable medium as recited in claim 9, further comprising: if decoding fails, iterating by adding one erasure symbol per iteration until decoding is successful or a predetermined number of iterations have been run.

17. A system for erasure flagging for errors-and-erasures decoding in storage devices, comprising:
    a head configured to interact with data tracks formed on a storage medium, the tracks having a geometrical reference against which a position of the head can be measured;
    a sensor configured to determine a position of the head relative to the geometrical reference of the track;
    a processor configured to compute a deviation from the position of the head relative to the geometrical reference, the processor further configured to determine a reliability value for each symbol in the track based upon the deviation for that symbol, the processor further configured to flag symbols as erasures based upon the determined reliability; and
    a decoder configured to perform errors-and-erasures decoding of the symbols.

18. The system as recited in claim 17, wherein the geometrical reference includes a centerline of the track being scanned.

19. The system as recited in claim 17, further comprising a model to differentiate between states based on the deviation, where each state has an associated reliability value.

20. The system as recited in claim 19, wherein the deviation includes three states including an on track state, an in-between tracks state and a wrong track state.

21. The system as recited in claim 19, wherein a state includes sub-states for further associating the reliability value to the deviation within the state.

22. The system as recited in claim 17, wherein the associated reliability value is computed based on one of simulations and accumulated statistical data.

23. The system as recited in claim 17, wherein the reliability value is computed as $P(e/S_k)=P(1/0,S_k)P(0)+P(0/1,S_k)P(1)$ where $P(e/S_k)$ is the probability of error in state $S_k$ where $P(i/j, S_k)$ denotes the probability of deciding i, given j is actually true given that a system is in state $S_k$.

* * * * *